(12) United States Patent
Mutnury et al.

(10) Patent No.: US 8,325,459 B2
(45) Date of Patent: Dec. 4, 2012

(54) CHANNEL PERFORMANCE OF ELECTRICAL LINES

(75) Inventors: Bhyrav M. Mutnury, Austin, TX (US); Terence Rodrigues, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 12/633,480

(22) Filed: Dec. 8, 2009

(65) Prior Publication Data

US 2011/0132648 A1    Jun. 9, 2011

(51) Int. Cl.
H05K 1/11 (2006.01)
(52) U.S. Cl. .................... 361/266; 361/260; 361/262
(58) Field of Classification Search .................. 361/266; 174/266
See application file for complete search history.

(56) References Cited

U.S. PATENT DOCUMENTS

| | | | |
|---|---|---|---|
| 5,764,489 A * | 6/1998 | Leigh et al. ................. | 361/777 |
| 6,677,831 B1 | 1/2004 | Cheng et al. | |
| 6,759,921 B1 | 7/2004 | Govind et al. | |
| 6,900,533 B2 | 5/2005 | Burton | |
| 7,015,574 B2 | 3/2006 | Alcoe et al. | |
| 7,088,200 B2 | 8/2006 | Bartley et al. | |
| 7,332,805 B2 | 2/2008 | Natarajan et al. | |
| 7,521,781 B2 | 4/2009 | Jin | |
| 2002/0189849 A1 * | 12/2002 | Hirose et al. ................. | 174/250 |
| 2005/0103523 A1 | 5/2005 | Burton | |
| 2006/0118331 A1 * | 6/2006 | Nelson et al. ................. | 174/261 |
| 2006/0197625 A1 * | 9/2006 | Kashiwakura ................. | 333/33 |
| 2007/0132527 A1 | 6/2007 | Chen | |

FOREIGN PATENT DOCUMENTS

| | | |
|---|---|---|
| JP | 01185994 A2 | 7/1989 |
| JP | 05235194 A2 | 9/1993 |

OTHER PUBLICATIONS

E. D. Blackshear et al., "The Evolution of Build-Up Package Technology and Its Design Challenges," IBM J. Res. & Dev., vol. 49, No. 4/5, 2005, pp. 641-661.
T. Swirbel et al., "Electrical Design and Simulation of High Density Printed Circuit Boards," IEEE Trans. on Adv. Pack., vol. 22, Issue 3, Aug. 1999, pp. 416-423.

* cited by examiner

*Primary Examiner* — Tuan T Dinh
*Assistant Examiner* — Steven Sawyer
(74) *Attorney, Agent, or Firm* — Law Office of Jim Boice

(57) ABSTRACT

A first via and a second via pass through a layer of a multi-layered circuit board. A first set of electrical transmission line segments, each having a first thickness, is aligned at a first area on the layer between the first and second vias. A second set of electrical transmission line segments, each having a second thickness that is greater than the first thickness, are aligned at a second area that is offset to the first area and to the first and second vias. The first set of electrical transmission line segments is connected to the second set of electrical transmission line segments to form an electrical transmission line, which has an average impedance that matches a line impedance of a uniform thickness line.

15 Claims, 3 Drawing Sheets

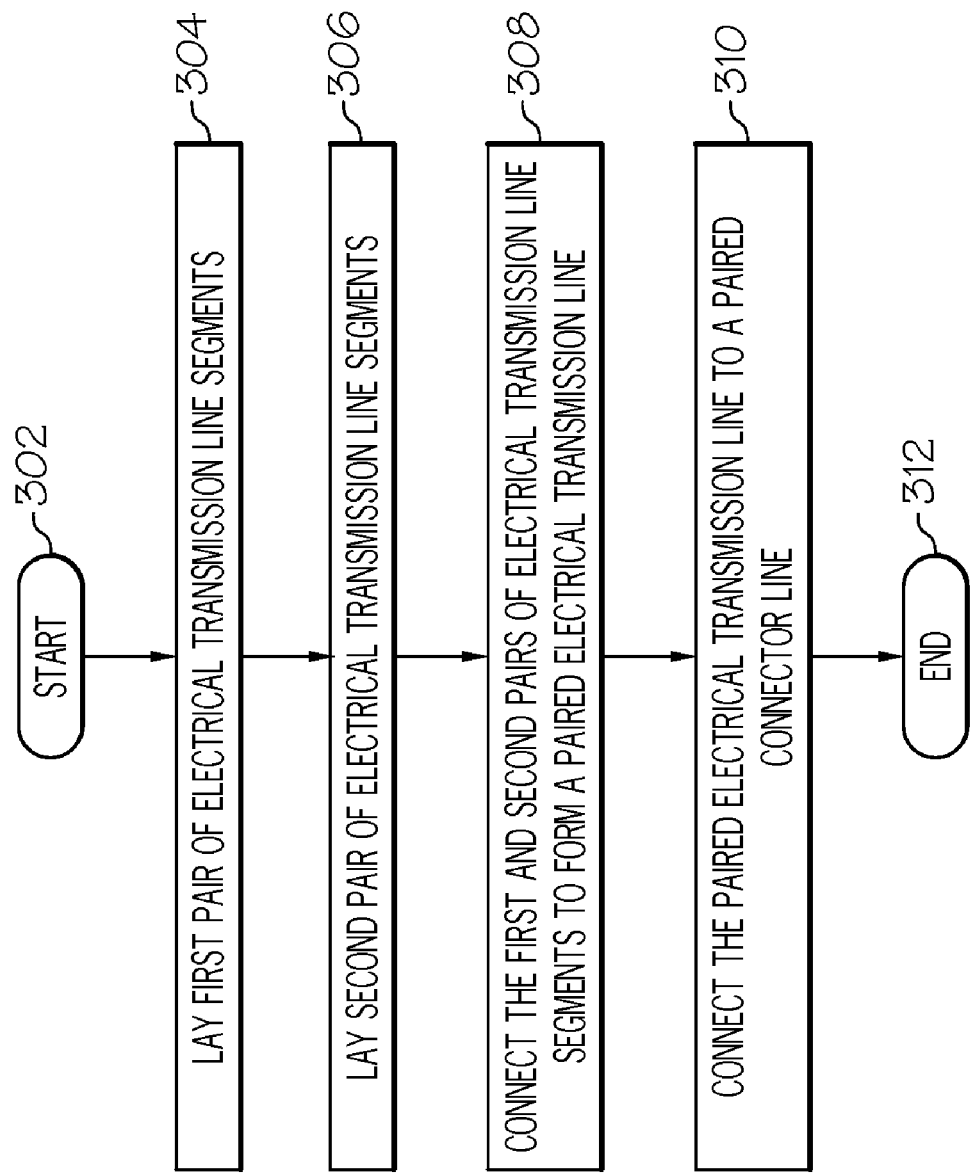

CHANNEL PERFORMANCE OF ELECTRICAL LINES

BACKGROUND

The present disclosure relates to the field of computers, and specifically to hardware components of a computer. Still more particularly, the present disclosure relates to channel performance that is affected by vias in a circuit board.

BRIEF SUMMARY

One embodiment of the present disclosure presents a circuit board. A first via and a second via pass through a layer of the circuit board. A first set of electrical transmission line segments, each having a first thickness, is aligned at a first area on the layer between the first and second vias. A second set of electrical transmission line segments, each having a second thickness that is greater than the first thickness, is aligned at a second area that is offset to the first area and to the first and second vias. The first set of electrical transmission line segments is connected to the second set of electrical transmission line segments to form an electrical transmission line, which has an average impedance that matches a line impedance of a uniform thickness line.

One embodiment of the present disclosure presents a system in which the circuit board described herein is used to electrically couple a chip to the overall computer system.

One embodiment of the present disclosure presents a method of manufacturing the circuit board described herein. In one embodiment, this method comprises laying a first pair of electrical transmission line segments in a first area between a pair of vias on a layer of the circuit board, wherein the pair of vias traverse through the layer of the circuit board, and wherein each line segment in the first pair of electrical transmission line segments has a first thickness. A second pair of electrical transmission line segments is laid in a second area, wherein the second area is offset to the first area and to the pair of vias, and wherein each line segment in the second pair of electrical transmission line segments has a second thickness that is greater than the first thickness. The first pair of electrical transmission line segments is coupled to the second pair of electrical transmission line segments to form a paired electrical transmission line. The paired electrical transmission line is coupled to a paired connector line, wherein the first and second thicknesses cause the paired electrical transmission line to have an average impedance that matches a connector line impedance of the paired connector line.

BRIEF DESCRIPTION OF THE SEVERAL VIEWS OF THE DRAWINGS

FIG. 3 is a high level flow chart of exemplary steps taken to fabricate the exemplary multi-layer PCB depicted in FIG. 1.

DETAILED DESCRIPTION

Figure 1:
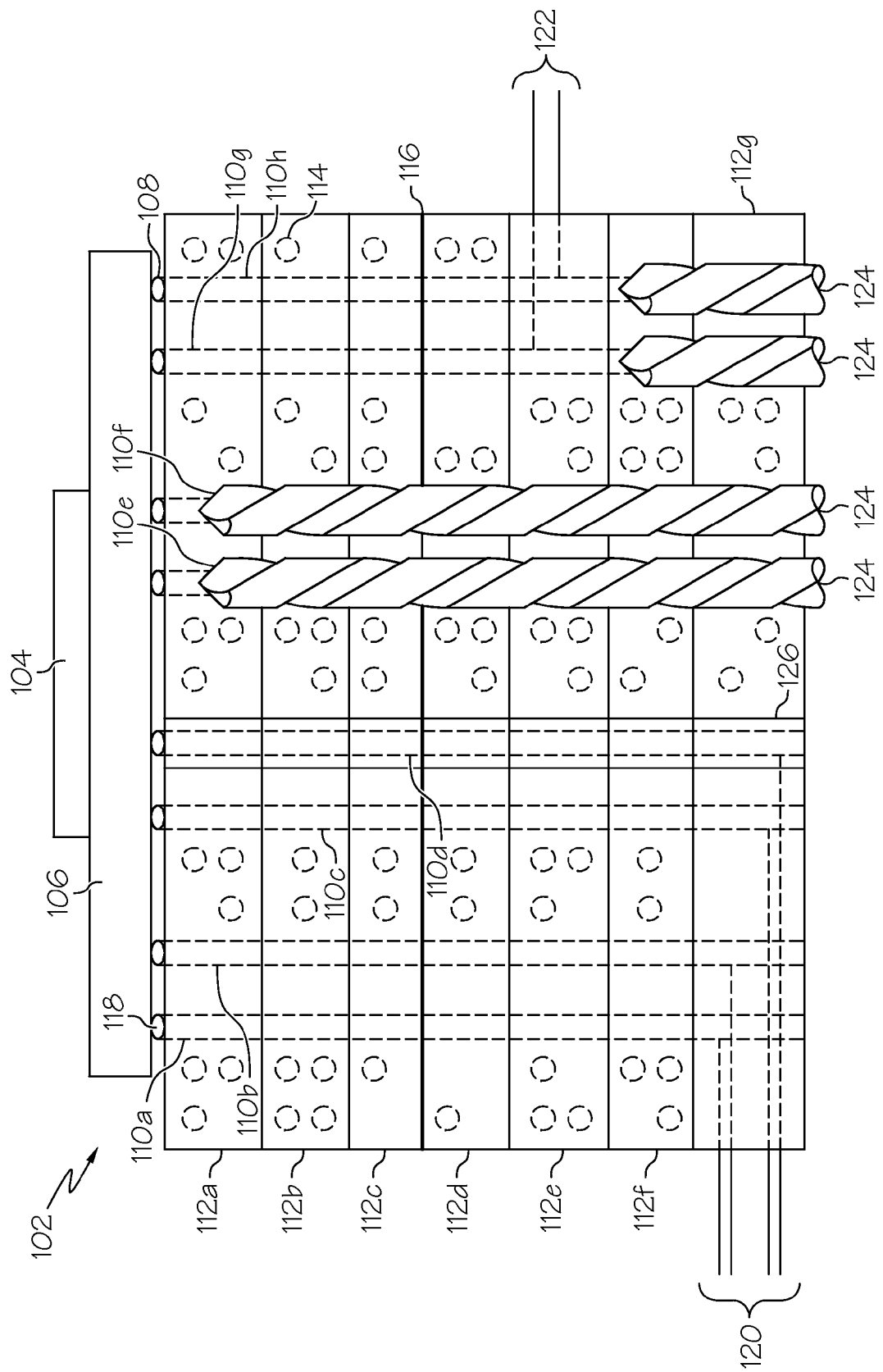
FIG. 1 depicts an exemplary multi-layer printed circuit board (PCB) in which the present disclosure can be utilized.

With reference now to FIG. 1, a cutaway side view of an exemplary novel printed circuit board (PCB) 102 is depicted. PCB 102 is physically and electrically coupled to a chip 104 via a connector such as a ball grid array (BGA) 106. BGA 106 has multiple solder balls, including solder ball 108, located on a lower surface. Pins (not shown) from chip 104 are electrically coupled to the solder balls. When subjected to moderately high heat, the solder balls melt, causing a physical and electrical connection to form between BGA 106 and vias 110a-h. Note that while only eight vias 110 are depicted for clarity in FIG. 1, it is understood that PCB 102 actually has dozens of vias 110 traversing through multiple layers, including the depicted layers 112a-g. Each of the layers contains circuitry, including exemplary depicted wire 114. A layer may be dedicated to signal transmission, power supply, etc. Each layer is separated by an insulation layer, such as the dielectric insulation layer 116 (not to scale) that separates layer 112c from layer 112d.

Each of the vias 110 are lined with a conductive material (not shown), such as copper. For example, melting solder ball 118 causes an electrical connection to be made between solder ball 118 and layer 112a, and then continuing down uninterrupted to layer 112g. In this manner, it is understood that a via is defined as both an opening (hole) as well as the conductive lining within the opening.

As depicted in FIG. 1, vias 110a-d are coupled to connector lines 120, which lead to other circuitry (also not shown) in a computer system. Connector lines 120 exit from layer 112g. Similarly, connector lines 122 emerge from layer 112e, and are coupled to vias 110g-h. However, vias 110e-f are blind vias, and have no connector lines coming away from them. This results in stubs (i.e., the copper lining of vias 110e-f) extending from BGA 106 into the PCB 102. Such stubs result in resonance, caused by electrical signals being sent down the vias 110e-f with no place to go. In order to eliminate such resonance, all of vias 110e-f are back-drilled out by one or more drill bits 124. Similarly, the section of vias 110g-h are back-drilled out through layers 112f-g, since the connector lines 122 terminate the useful portions of vias 110g-h at layer 112e.

As shown, the diameter of drill bits 124 is greater than the diameter of the vias 110. Thus, an anti-pad area (e.g., anti-pad area 126 around via 110d) is established around the vias. This anti-pad area is a restricted area through which no circuitry (e.g., wire 114) is permitted, such that a drill bit 124 can ream out a via without damaging any nearby circuitry. However, these anti-pad areas reduce the amount of space available on any layer of the PCB 102, since additional room (pitch) must be left between vias.

Figure 2:
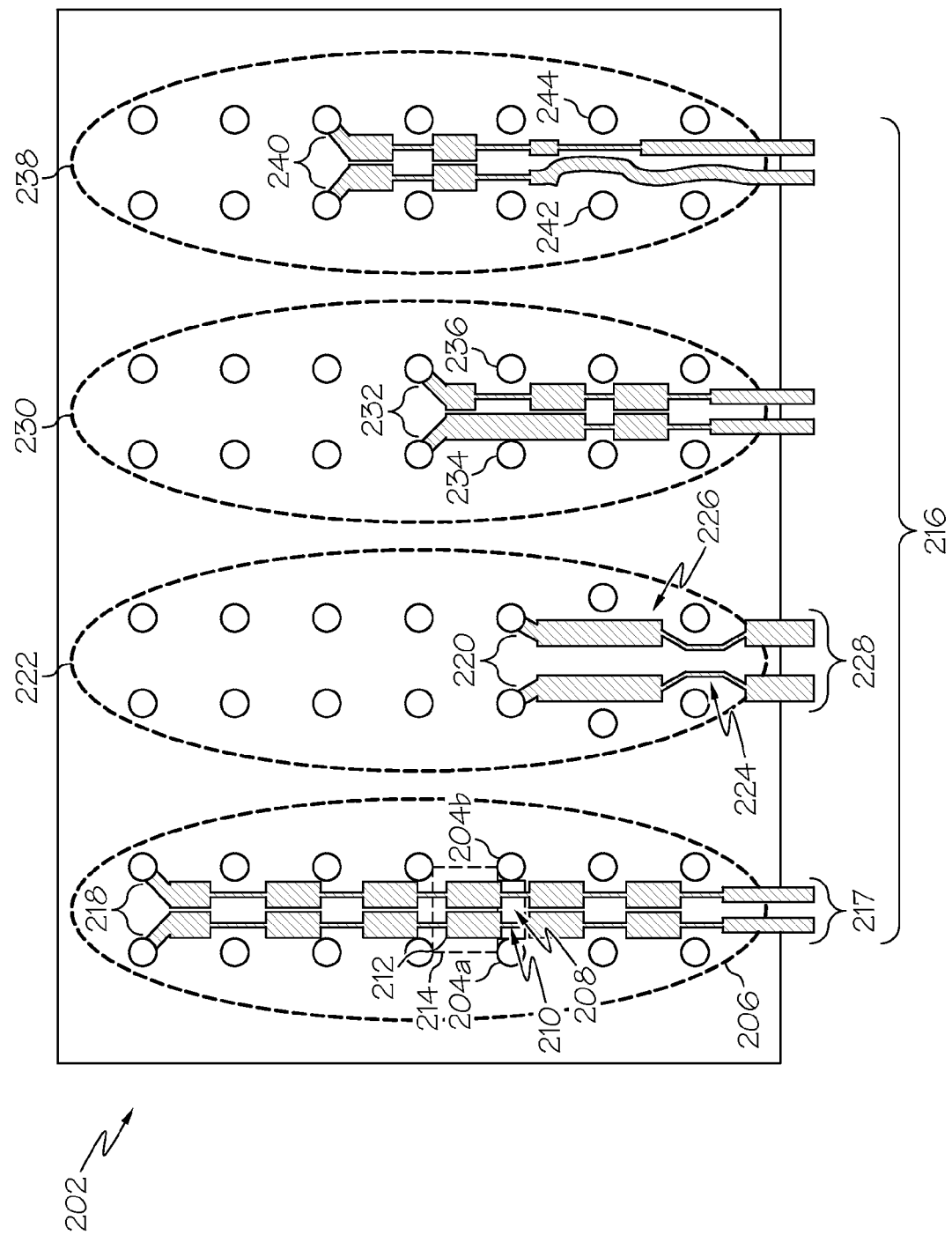
FIG. 2 illustrates an exemplary layer of the multi-layer PCB depicted in FIG. 1.

Referring now to FIG. 2, a top view of a layer 202 (e.g., any of the layers 112a-g shown in FIG. 1) is presented. Layer 202 has multiple vias, including a first via 204a and a second via 204b in a via set 206. While only some of the vias depicted in FIG. 2 may be candidates for back-drilling, and thus have anti-pad areas around them, for illustrative purposes assume that all of the vias shown in FIG. 2 have anti-pad areas around them. In a first area 208 between the first and second vias 204a-b are a first set of electrical transmission line segments 210. In order to avoid the anti-pad areas around these vias, the lines in the first set of electrical transmission line segments 210 are thinner than the thicker lines in a second set of electrical transmission line segments 212 in a second area 214. Thus, assuming that the spacing between the lines is the same, line impedance (which is directly related to the resistance of the transmission line segments) is higher in the first set of electrical transmission line segments 210 than that found in the second set of electrical transmission line segments 212. The lower impedance, caused by reducing the resistance of the second set of transmission line segments 212 by making them thicker (for example, having a larger thickness than that of connector lines 216—or similar to connector lines 120 as shown in FIG. 1) results in the overall impedance of the total electrical transmission line 218 (made up of all of the first and second sets of transmission line segments) being equal to, below, or just above that of the connector lines 216. Thus, the electrical transmission line 218 (made up of the combined first and second sets of electrical transmission line segments 210/212 between the via set 206) has an impedance that is the same as the connector lines 217, and yet is still necked down between vias in order to avoid any anti-pad areas.

Note that while the first and second sets of transmission line segments 210 and 212 are described as if they were separate segments that are later joined to form the electrical transmission line 218, in one embodiment electrical transmission line 218 is laid down as a single unit, such that it is thinner between vias and thicker when not between vias. In another embodiment, a thin transmission line 218 is initially laid down as a thin line, and the thicker portions (e.g., second set of transmission line segments 212) are overlaid on top of that relatively thin line.

In another embodiment of the present disclosure, the overall impedance of a transmission line is adjusted by adjusting a distance between lines, depending on their thickness. For example, consider the electrical transmission line 220 shown between part of via set 222. Depicted is a second set of electrical transmission line segments 224 (analogous to the second set of electrical transmission line segments 212 described herein) that is made up of a pair of lines that are spaced farther apart than the lines of the first set of electrical transmission line segments 226 (analogous to the first set of electrical transmission line segments 210 described herein). This spacing takes advantage of the fact that impedance is inversely related to this spacing difference. Thus, although the lines in the second set of electrical transmission line segments 224 have more resistance (due to being thinner), they have the same impedance as connector lines 228 since they are spaced closer together.

As depicted within via set 230, the thickness of the electrical transmission line 232 can be adjusted such that the thickness remains the same next to a via that is known will never be back drilled (via 234), while making the line thinner when next to a via that will or may be back drilled (via 236). Thus, other areas of the electrical transmission line 232 need be made thicker to a lesser degree (since both lines between the vias are not thinned).

As depicted within via set 238, the electrical transmission line 240 can be adjusted by simply routing a relatively thick line around an anti-pad area of a via (such as, for example, via 242). If there is not enough space between via 242 and via 244, then one of the lines may still need to be made thin (as depicted). However, if there is enough space between vias 242 and 244, then both lines can be formed as relatively thick lines.

Referring now to FIG. 3, a high level flow chart of some of the steps taken to fabricate the novel PCB described herein. After initiator block 302, a first pair of electrical transmission line segments are laid in a first area between a pair of vias on a layer of the circuit board (block 304). As described herein, this pair of vias traverse multiple layers of the PCB, including through the layer of the circuit board on which the first pair of electrical transmission line segments are laid. As described herein, each line segment in the first pair of electrical transmission line segments has a first thickness. As described in block 306, a second pair of electrical transmission line segments is laid in a second area. This second are is offset to the first area and to the pair of vias. As depicted and described herein, each line segment in the second pair of electrical transmission line segments has a second thickness that is greater than the first thickness. As described in block 308, the first pair of electrical transmission line segments is connected to the second pair of electrical transmission line segments to form a paired electrical transmission line. Note again that these segments may actually be part of a single fabricated set of lines, in which the thickness is varied during fabrication according to the proximity of the vias (and their associated/presumed anti-pad areas). As described in block 310, the paired electrical transmission line is connected to a paired connector line. Thus, the first and second thicknesses cause the paired electrical transmission line to have an average impedance that matches a connector line impedance of the paired connector line. In another embodiment, however, impedance is adjusted by reducing a spacing between the line segments in the first set of line segments. Thus, reducing the spacing between the line segments in the first set of line segments causes a second impedance for the second pair of electrical transmission line segments to be reduced to a same level as a first impedance for the first pair of electrical transmission of line segments. The process ends at terminator block 312.

Note that while the PCB depicted herein is multilayered, the present disclosure is also useful and can be implemented on a single-layer PCB in which one or more connector holes in the single-layer PCB are possible candidates for being drilled out in a similar manner to the back drilling described herein.

Note also that the present disclosure describes transmission lines and connector lines as being paired couples, thus taking advantage of the reduced impedance and lower noise associated with such paired couples (e.g., with one wire being positive and the other wire being negative). Alternatively, however, such lines can be made up of a single line, or by any multiple number of lines.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims herein are intended to include any structure, material, or act for performing the function in combination with other claimed elements as specifically claimed. The description of various embodiments of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Having thus described embodiments of the disclosure of the present application in detail and by reference to illustrative embodiments thereof, it will be apparent that modifications and variations are possible without departing from the scope of the disclosure defined in the appended claims.

What is claimed is:

1. A circuit board comprising: a layer; a first via passing through the layer; a second via passing through the layer: a first set of electrical transmission line segments at a first area of the layer, wherein the first area is between the first and second vias and wherein at least one of the first set of electrical transmission line segments has a first thickness; and a second set of electrical transmission line segments on a second area of the layer, wherein the second area is offset to the first area and to the first and second vias, wherein, at least one of the second, set of electrical transmission line segments has a second thickness that is greater than the first thickness wherein the first set of electrical transmission line segment is connected to the second set of electrical transmission line segment to form an electrical transmission line, wherein an anti-pad area surrounds the first via, wherein circuitry is prohibited within the anti-pad area wherein the first and second thicknesses cause the electrical transmission line to have an average impedance that matches a line impedance of a uniform thickness line, and a connector line connected to the electrical transmission line, wherein the connector line has the line impedance of the uniform thickness line.

2. The circuit board of claim 1, wherein the circuit board comprises multiple layers.

3. The circuit board of claim 1, wherein the electrical transmission line is a single transmission line, and wherein the first and second sets of electrical transmission line segments form the single transmission line.

4. The circuit board of claim 1, wherein the electrical transmission line is composed of two transmission lines, and wherein the first and second sets of electrical transmission line segments both form the two lines.

5. The circuit board of claim 1, wherein the first and second sets of electrical transmission line segments each comprise more than two lines.

6. The circuit board of claim 4, wherein both lines formed by the first set of electrical transmission line segments have the first thickness, and wherein both lines formed by the second set of electrical transmission line segments have the second thickness.

7. The circuit board of claim 4, wherein at least one of the lines from the first set of electrical transmission line segments curves around the anti-pad area.

8. The circuit board of claim 4, wherein the lines in the second set of electrical transmission line segments are aligned closer together than the lines in the first set of electrical transmission line segments, wherein the second set of electrical transmission line segments and the first set of electrical transmission line segments have a same impedance level.

9. A system comprising: a processing unit electrically coupled to a multi-layer circuit board, wherein the multi-layer circuit board comprises: a layer; a first via passing through the layer; a second via passing through the layer; a first set of electrical transmission line segments at a first area of the layer, wherein the first area is between the first and second vias, and wherein at least one of the first set of electrical transmission line segments has a first thickness; and a second set of electrical transmission line segments on a second area of the layer, wherein the second area is offset to the first area and to the first and second visa, wherein at least one of the second set of electrical transmission line segments has a second thickness that is greater than the first thickness, wherein the first set of electrical transmission line segments is connected to the second set of electrical transmission line segments to form an electrical transmission line, wherein an anti-pad area surrounds the first via, wherein circuitry is prohibited within the anti-pad area, and wherein the first and second thicknesses cause the electrical transmission line to have an average impedance that matches a line impedance of a uniform thickness line, and wherein a connector line connected to the electrical transmission line, wherein the connector line has the line impedance of the uniform thickness line.

10. The system of claim 9, wherein the first and second sets of electrical transmission line segments together form a single line.

11. The system of claim 9, wherein the first and second sets of electrical transmission line segments each comprise two lines.

12. The system of claim 11, wherein both lines in the first set of electrical transmission line segments have the first thickness, and wherein both lines in the second set of electrical transmission line segments have the second thickness.

13. The system of claim 11, wherein both of the two lines of the electrical transmission line are aligned in a straight line.

14. The system of claim 11, wherein at least one of the lines from the first set of electrical transmission line segments curves around the anti-pad area.

15. The system of claim 11, wherein the lines in the second set of electrical transmission line segments are aligned closer together than the lines in the first set of electrical transmission line segments, wherein the second set of electrical transmission line segments and the first set of electrical transmission line segments have a same impedance level.

* * * * *